US011494319B1

(12) United States Patent
Kim et al.

(10) Patent No.: US 11,494,319 B1
(45) Date of Patent: Nov. 8, 2022

(54) APPARATUSES, SYSTEMS, AND METHODS FOR INPUT/OUTPUT MAPPINGS

(71) Applicant: MICRON TECHNOLOGY, INC., Boise, ID (US)

(72) Inventors: Jaeil Kim, Boise, ID (US); Suryanarayana B. Tatapudi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/445,271

(22) Filed: Aug. 17, 2021

(51) Int. Cl.
*G06F 13/16* (2006.01)
*G11C 11/4093* (2006.01)
*G06F 11/10* (2006.01)

(52) U.S. Cl.
CPC ...... *G06F 13/1668* (2013.01); *G06F 11/1068* (2013.01); *G11C 11/4093* (2013.01)

(58) Field of Classification Search
CPC ............ G11C 11/4093; G06F 11/1068; G06F 13/1668
See application file for complete search history.

(56) References Cited

U.S. PATENT DOCUMENTS

2013/0086309 A1* 4/2013 Lee ...................... G11C 7/1072 711/E12.008
2017/0060789 A1* 3/2017 Noda .................. G11C 7/1069
2020/0004420 A1* 1/2020 Gans ...................... G11C 5/025
2021/0359704 A1* 11/2021 Chen .................. G06F 11/1004

* cited by examiner

*Primary Examiner* — Guy J Lamarre
(74) *Attorney, Agent, or Firm* — Dorsey & Whitney LLP

(57) ABSTRACT

A memory device may support multiple DQ maps. Two or more of the DQ maps may support memory operations using a same input-output width. In some examples, one or more components for supporting a DQ map for a different input-output width may be used to also support one or more of the DQ maps for the same-input output width.

22 Claims, 8 Drawing Sheets

APPARATUSES, SYSTEMS, AND METHODS FOR INPUT/OUTPUT MAPPINGS

BACKGROUND

Semiconductor memories are used in many electronic systems to store data that may be retrieved at a later time. Information may be stored on individual memory cells of the memory as a physical signal (e.g., a charge on a capacitive element). The memory cells may be arranged in a memory array of rows (e.g., word lines) and columns (e.g., bit lines). The memory array may be further organized into bank groups, banks, planes, etc.

An external device, such as a memory controller, may provide data along with a write command to the semiconductor memory to store data in the memory array. The data may be provided to one or more external data terminals (DQ terminals) serially. The data is deserialized (e.g., parallelized) by the semiconductor memory and provided to the memory array for storage in the memory cells. To retrieve the data, the external device may provide a read command to the semiconductor memory. In response, the semiconductor device may retrieve the data from the memory array in parallel. The semiconductor memory may serialize the data and provide the data via the DQ terminals to the external device.

The location of the data in the memory array may be indicated by a memory address, which may indicate the bank and row of the memory cells where the data is stored. Depending on the organization of the memory array, the address may further indicate a sub-portion of the bank or other portion of the memory array. The memory address may be provided by the external device to the semiconductor memory along with the read and write commands.

While the memory address may indicate where data is to he stored in the memory array, the data may be provided to or from the location in the memory array from or to the DQ terminals in a predetermined format, referred to as a DQ map. The DQ map may provide a relationship between memory cells of the memory array and the DQ terminals. For example, the DQ map may indicate the data from which memory cells are provided to which DQ terminals and in which order. The DQ map may also indicate the data from which DQ terminals received at different times are provided to which memory cells of the memory array. The DQ map may be based on one or more factors such as the number of DQ terminals, burst length, and organization of the memory array.

DETAILED DESCRIPTION

Apparatuses and methods, including circuits, DQ maps, and memory array layouts for supporting multiple DQ mappings in a memory device are disclosed, Different DQ mappings may be provided for different data input-output (I/O) widths (e.g., a number of utilized DQ terminals). In some embodiments, multiple DQ mappings may be supported for a same data I/O width (e.g., a same number of active DQ terminals). In some embodiments, the different DQ mappings for the same 110 width may provide at least some different features from one another. In some embodiments, circuitry for supporting DQ maps for different 110 widths may be used to support, at least in part, one or more of the multiple DQ maps for the same I/O width.

Figure 1:
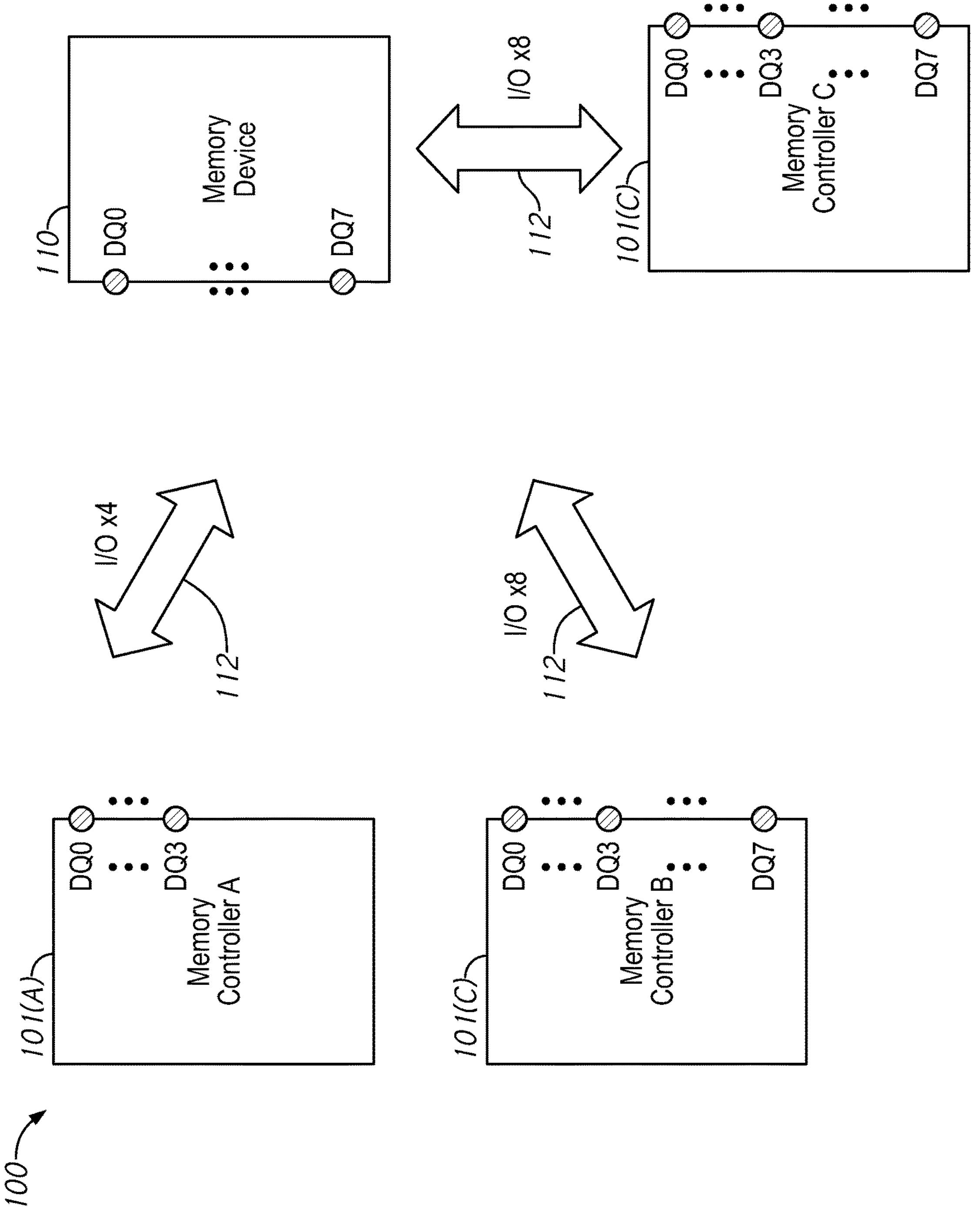
FIG. 1 is a block diagram of a system according to at least one embodiment of the disclosure.

FIG. 1 is a block diagram of example systems according to at least one embodiment of the disclosure. The system 100 includes a memory controller, such as memory controller 101(A), 101(B), or 101(C) and a memory device 110. The memory device 110 may be a dynamic random access memory (DRAM) device in some examples. In some examples, the memory device 110 may be a double data rate (DDR) DRAM device. The memory device 110 may include, in some example, one or more separate memory devices, embedded memory, etc. In some examples, the memory device 110 may be included in a memory module. In some examples, the one or more of the memory controllers may be included in a same package, and represent a system on chip. Other examples may implement the system 100 in different arrangements, but still remain within the scope of the present disclosure. Memory controllers 101(A)-101(C) may come in a variety of I/O widths. For example, memory controller 101(A) has an IO width of four (x4). That is, it has four DQ terminals DQ0-3 for providing and receiving data. In contrast, memory controllers 101(B) and 101(C) have eight DQ terminals DQ0-7 (x8) for providing and receiving data. One of the memory controllers 101(A)-101(C) may provide data to and receive data from the memory device 110 via the DQ terminals on the memory controller 101(A)-101(C) and corresponding DQ terminals of the memory device 110. The DQ terminals of the memory controller 101(A)-101(C) and the memory device 110 may be coupled by conductive paths that may be referred to collectively as a data bus as indicated by arrows 112.

While in some applications, the memory device 110 may be designed specifically to be used with a particular memory controller, memory device 110 may be designed to support operations with different memory controllers as indicated in FIG. 1. In the example shown in FIG. 1, memory device 110 includes eight DQ terminals DQ0-7. The memory device 110 may support operation with memory controllers that only include four DQ terminals, such as memory controller 101(A) as well as operation with memory controllers 101(B) and 101(C) which include eight DQ terminals. In some applications, the memory device 110 may include two DQ maps, one utilizing a subset of the DQ terminals, such as four DQ terminals (e.g., an I/O width of x4) and one utilizing all of the DQ terminals, such as eight DQ terminals (e.g., an I/O width of x8). The number of DQ terminals of the memory controllers are provided merely as examples, and memory controllers may have more or fewer DQ terminals in other examples (e.g., two, sixteen, thirty-two).

As systems and their applications become more diverse, memory controllers may have other characteristics that vary or the systems that include the memory controller and the memory device may have different requirements. example, memory controller 101(C) may be included in a system or perform operations that are more sensitive to errors than memory controller 101(B). In another example, memory controller 101(B) may be included in a system or perform operation that require faster data transfer According to embodiments of the present disclosure, a memory device, such as memory device 110, may support multiple DQ maps for a same I/O width (e.g., a same/equal number of DQ terminals). The multiple DQ maps may accommodate different memory controller characteristics and/or system requirements in some examples. This may allow a single memory device to support a wider variety of products.

As disclosed herein, a memory device may support one or more DQ maps for different I/O widths in some embodiments. Returning to the example in FIG. 1, memory device 110 may include a DQ map for an I/O width of x4 as well as two or more DQ maps for an I/O width x8 in order to support operation with all memory controllers 101(A)-101(C). In sonic embodiments, circuitry for the DQ map for the I/O width of x4 may be used to support one or more of the DQ maps for the I/O width x8. In some applications, this may reduce the number of components added to support the additional DQ maps.

Figure 2:
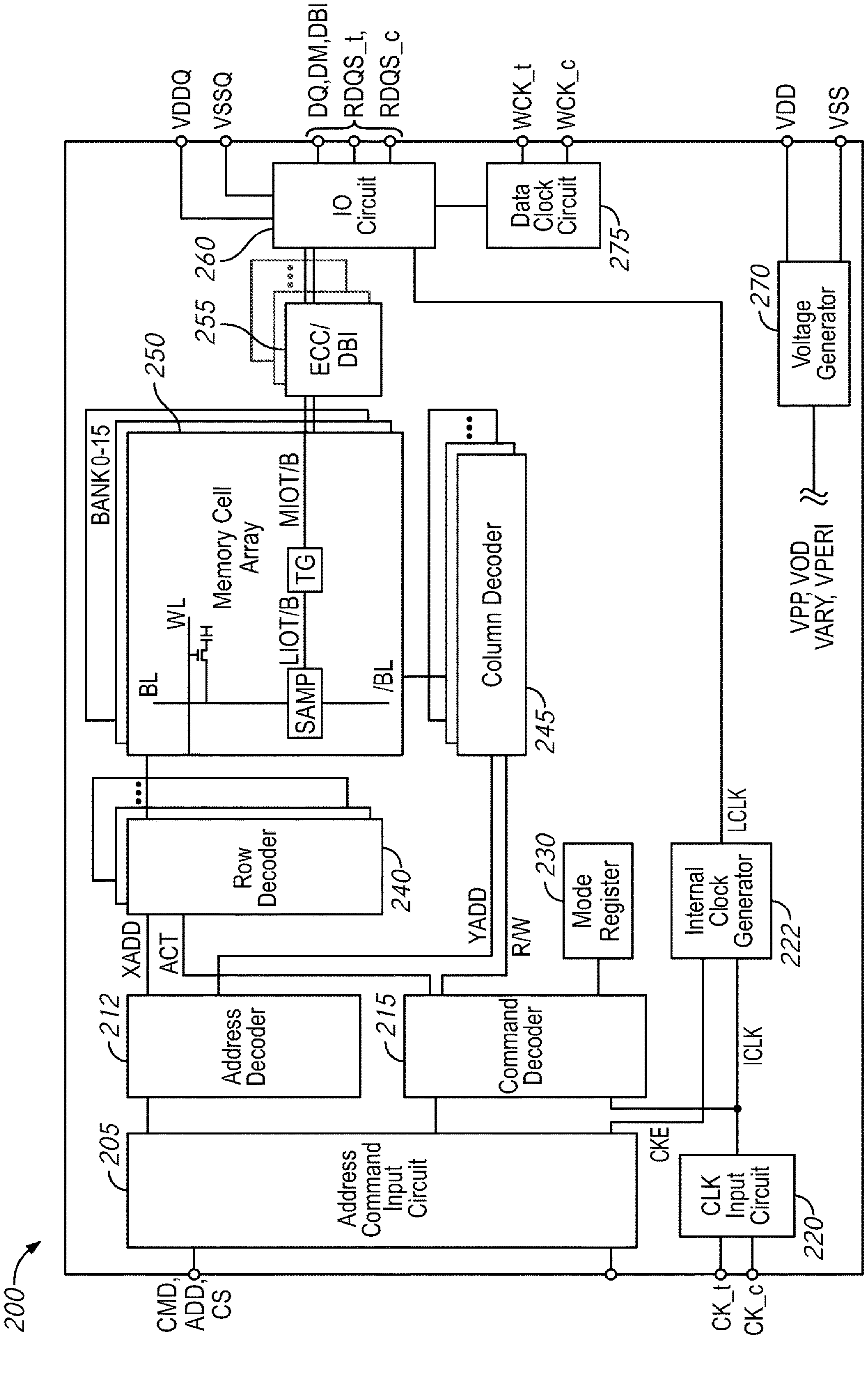
FIG. 2 is a block diagram of an apparatus according to at least one embodiment of the disclosure.

FIG. 2 is a block diagram of an apparatus according to at least one embodiment of the disclosure. The apparatus may be a semiconductor device 200, and will be referred to as such. The semiconductor device 200 may include, without limitation, a DRAM device. The semiconductor device 200 may be integrated into a single semiconductor chip in some embodiments of the disclosure. In some embodiments, the semiconductor device 200 may be included in memory device 110 of FIG. 1.

The semiconductor device 200 includes a memory array 250. The memory array 250 is shown as including a plurality of memory banks. In the embodiment of FIG. 2, the memory array 250 is shown as including sixteen memory banks BANK0-BANK5, however memory array 250 may have more or fewer memory banks in other examples (e.g., 4,8,32). In some examples, the memory banks may be organized into bank groups BG. For example, memory banks BANK0-15 may be organized into four bank groups BG0-3, where each bank group includes four banks. In another example, memory banks BANK0-15 may be organized into eight bank groups where each bank group includes two banks. In yet another example, memory banks BANK0-15 may be organized into two bank groups where each bank group includes eight banks. Other groupings may also be used. In some embodiments, not shown in FIG. 2, each memory bank BANK0-15 may be organized into one or more planes (sometimes referred to as memory mats). For example, each memory bank BANK0-15 may include sixteen planes.

Each memory bank includes a plurality of word lines WL, a plurality of bit lines BL and /BL, and a plurality of memory cells MC arranged at intersections of the plurality of word lines WL and the plurality of bit lines BL and /BL. Selection of the word line WL is performed by a row decoder 240 and selection of the bit lines BL and /BL. is performed by a column decoder 245. In the embodiment of FIG. 2, the row decoder 240 includes a respective row decoder for each memory bank and the column decoder 245 includes a respective column decoder for each memory bank. The bit lines BL and /BL are coupled to a respective sense amplifier (SAMP). Read data from the bit line BL or /BL is amplified by the sense amplifier SAMP, and transferred to error correction and data bus inversion control (ECC/DBI) circuit 255 over complementary local data lines (LIOT/B), transfer gate (TG), and complementary main data lines (MIOT/B). Conversely, write data outputted from the ECC/DBI circuit 255 is transferred to the sense amplifier SAMP over the complementary main data lines MIOT/B, the transfer gate TG, and the complementary local data lines LIOT/B, and written in the memory cell MC coupled to the bit line BL or /BL.

Although the row decoder 240, column decoder 245, and other components are shown outside the memory array 250 in FIG. 2, the semiconductor device 200 may have different arrangements. For example, all or a portion of row decoder 240 may be disposed between groups of planes of the memory banks BANK0-15.

The ECC/DBI circuit 255 may perform error correction encoding and decoding. For example, the ECC/DBI circuit 255 may receive ECC data (e.g., one or more parity hits) associated with read data and perform error correction operations to correct the read data, if necessary, and provide ECC data with the read data to an external device, such as a memory controller (e.g., memory controllers 101(A)-101(C)). Similarly, the ECC/DBI circuit 255 may receive ECC data associated with write data and perform error correction operations to correct the write data, if necessary, and provide FCC data to be stored with the write data to the memory array 250, The ECC/DBI circuit 255 may also perform DBI operations to generate DBI information. The DBI information may be used to encode and/or decode read and/or write information to reduce voltage transitions at the DQ terminals. This may reduce power consumption during data transfer in some applications. In some applications, the FCC and/or DBI operations performed by the ECC/DBI circuit 255 may be optional. Although shown as a single component in FIG. 2, the ECC/DBI circuit 255 may include multiple circuits in some embodiments. In some embodiments, the circuits for providing FCC data may be separate from the circuits for providing DBI information.

The semiconductor device 200 may employ a plurality of external terminals that include command and address and chip select (CA/CS) terminals coupled to a command and address bus to receive commands and addresses, and a CS signal. The external terminals may further include clock terminals to receive clocks CK_t and CK_c, and data clocks WCK_t and WCK_c, and to provide access data clocks RDQS_t and RDQS_c, data terminals DQ, data mask terminal DM and data bus inversion terminal(s) DBI, and power supply terminals to receive power supply potentials VDD, VSS, VDDQ, and VSSQ.

The clock terminals are supplied with external clocks CK_t and CK_c that are provided to an input buffer 220. The external clocks may be complementary. The input buffer 220 generates an internal clock ICLK based on the CK_t and CK_c clocks, The ICLK clock is provided to the command decoder 215 and to an internal clock generator 222. The internal clock generator 222 provides various internal clocks LCLK based on the ICLK clock. The LCLK clocks may be used for timing operation of various internal circuits. Data clocks WCK_t and WCK_c are also provided to the external clock terminals. The WCK_t and WCK_c clocks are provided to a data clock circuit 275, which generates internal data clocks based on the WCK_t and WCK_c clocks. The internal data clocks are provided to the input/output circuit 260 to time operation of circuits included in the input/output circuit 260 to time the receipt of write data.

The CA/CS terminals may be supplied with memory addresses. The memory addresses supplied to the CA/CS terminals are transferred, via a command/address input circuit 205, to an address decoder 212. The address decoder 212 receives the address and supplies a decoded row address XADD to the row decoder 240 and supplies a decoded column address YARD to the column decoder 245. The CA/CS terminals may be supplied with commands. Examples of commands include access commands for accessing the memory, such as read commands for performing read operations and write commands for performing write operations, mode register write and read commands for performing mode register write and read operations, as well as other commands and operations.

The commands may be provided as internal command signals to a command decoder 215 via the command/address input circuit 205. The command decoder 215 includes circuits to decode the internal command signals to generate various internal signals and commands for performing operations. For example, the command decoder 215 may provide a row command signal ACT to select a word line and a column command signal R/W to select a bit line.

The power supply terminals are supplied with power supply potentials VDD and VSS. The power supply potentials VDD and VSS are supplied to an internal voltage generator circuit 270. The internal voltage generator circuit 270 generates various internal potentials VPP, VOD, VARY, VPERI, and the like based on the power supply potentials VDD and VSS supplied to the power supply terminals, The internal potential VPP is mainly used in the row decoder 240, the internal potentials VOD and VARY are mainly used in the sense amplifiers SAMP included in the memory array 250, and the internal potential VPERI. is used in many peripheral circuit blocks.

The power supply terminals are also supplied with power supply potentials VDDQ and VSSQ. The power supply potentials VDDQ and VSSQ are supplied to the input/output circuit 260. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 260 so that power supply noise generated by the input/output circuit 260 does not propagate to the other circuit blocks.

When an activate command and a row address are received, followed by a read. command and a column address, read data and corresponding ECC data are read from memory cells in the memory array 250 corresponding to the row address and column address. The read command is received by the command decoder 215, which provides internal commands so that read data and corresponding ECC data from the memory array 250 is provided to the ECC/DBI circuit 255. The ECC/DBI circuit 255 executes ECC-decoding to produce corrected read data and corrected corresponding FCC data. For example, if the read data includes an error, as determined by the ECC control circuit 255 based on the corresponding ECC data, the read data is corrected. The ECC/DBI circuit 255 may further perform DBI operations to provide DBI information associated with the read data and corresponding ECC data. The read data, associated ECC data, and the DBI information are provided to the input/output circuit 260 and output to the data terminals DQ according to a DQ map (not shown in FIG. 2), In some examples, the DQ map may be selected.

When an activate command and a row address are received, followed by a write command and a column address, write data and corresponding ECC data supplied to the data terminals DQ is written to a memory cells in the memory array 250 corresponding to the row address and column address. DBI information may also be provided with the write data and corresponding ECC data via the DBI terminals. A data mask may be provided to the data mask terminals DM to mask portions of the data when written to memory. The write command is received by the command decoder 215, which provides internal commands so that the write data is received by input receivers in the input/output circuit 260. The write data, corresponding ECC data, and DBI information is supplied from the data terminals DQ via the input/output circuit 260 according to a DQ map to the ECC/DBI circuit 255, and by the ECC/DBI circuit 255 to the memory array 250 to be written into the memory cell MC. In some examples, the DQ map may be selected.

Read and write may be provided to the DQ terminals connection with one or more clock signals data (as well as ECC data and/or DBI information via the DQ terminals and/or DBI terminals in some embodiments), such as data clocks WCK_t and WCK_c, and to provide access data clocks RDQS_t and RDQS_c. Typically, each DQ terminal provides or receives a sequence of bits for each read or write operation. The number of bits in the sequence may be referred to as the burst length. Each bit in the sequence of bits is provided at the corresponding DQ terminal for at least a portion of a clock cycle of the appropriate clock signal and then the next bit in the sequence is provided to the DQ terminal. When the bits transition in relation to the clock signal (e.g., rising and/or falling edges) and for how long each hit is provided on the corresponding DQ terminal may be based, at least in part, on the structure of the semiconductor device 200, an industry standard (e.g., JEDEC), and/or an operating mode of the semiconductor device 200. Regardless of the clock frequency or other operating settings, the length of time each bit is present on the DQ terminal is referred to as a unit interval (UI). Thus, a burst length of 8 bits may take 8 UI to provide all of the bits to the DQ terminal for a read or a write operation.

When a sequence of bits is provided to the DQ terminals during a write operation, the IO circuit 260 may deserialize the sequence for further processing by the ECC/DBI circuit 255 (e.g., error correction and DBI operations) and writing to the memory array 250. The sequence of bits may be deserialized and provided in the memory array 250 according to a DQ map, which defines a relationship between the memory cells of the memory array 250 and the DQ terminals. The DQ map may indicate where in the memory array 250 each bit of the sequence of bits for each DQ terminal will be stored (e.g., which memory cell of the memory array 250 will store which bit received from the DQ terminals), Where the bit is stored is based, at least in part, on what DQ terminal the bit is received at and when in the sequence of bits the bit is received.

Similarly, when bits are provided to the DQ terminals during a read operation, the bits may be provided in parallel from the memory array 250 to the ECC/DBI 255 for processing and then to the IO circuit 260. The IO circuit 260 may serialize the bits according to the DQ map. The DQ map may indicate which DQ terminal each bit will be provided to and when in the sequence of bits each bit will be provided to the DQ terminal (e.g., which memory cell will provide which bit provided to the DQ terminals).

As noted with reference to FIG. 1, the semiconductor device 200 may include multiple DQ maps. As disclosed herein, DQ maps may be selected for different IO widths (e.g., a different number of the DQ terminals are used to receive and provide data) and/or for different operating characteristics. Semiconductor device 200 may include one or more components (e.g., signal lines, read/write drivers, logic circuits) to implement the multiple DQ maps. In some embodiments, at least some of the components may be included in IO circuit 260. In some embodiments, depending on the characteristics of the DQ maps, additional components may be included in other circuits, such as the ECC/DBI circuit 255. Collectively, the components for implementing one or more DQ maps may be referred to as circuits and/or circuitry. The DQ map may be selected in a variety of ways. For example, one or more fuses, anti-fuses, and/or switches may be used to activate or deactivate one or more components to implement the desired DQ map. In some embodiments, a manufacturer of the semiconductor device 200 may set the state of the fuses, anti-fuses, and/or switches. In some embodiments, an external device, such as a memory controller, may issue a command to set the state of the fuses, anti-fuses, and/or switches. In another example, the DQ map may be selected based, at least in part, on a value written to the mode register 230. The value may be written by a memory controller issuing a mode register write command.

Figure 3:
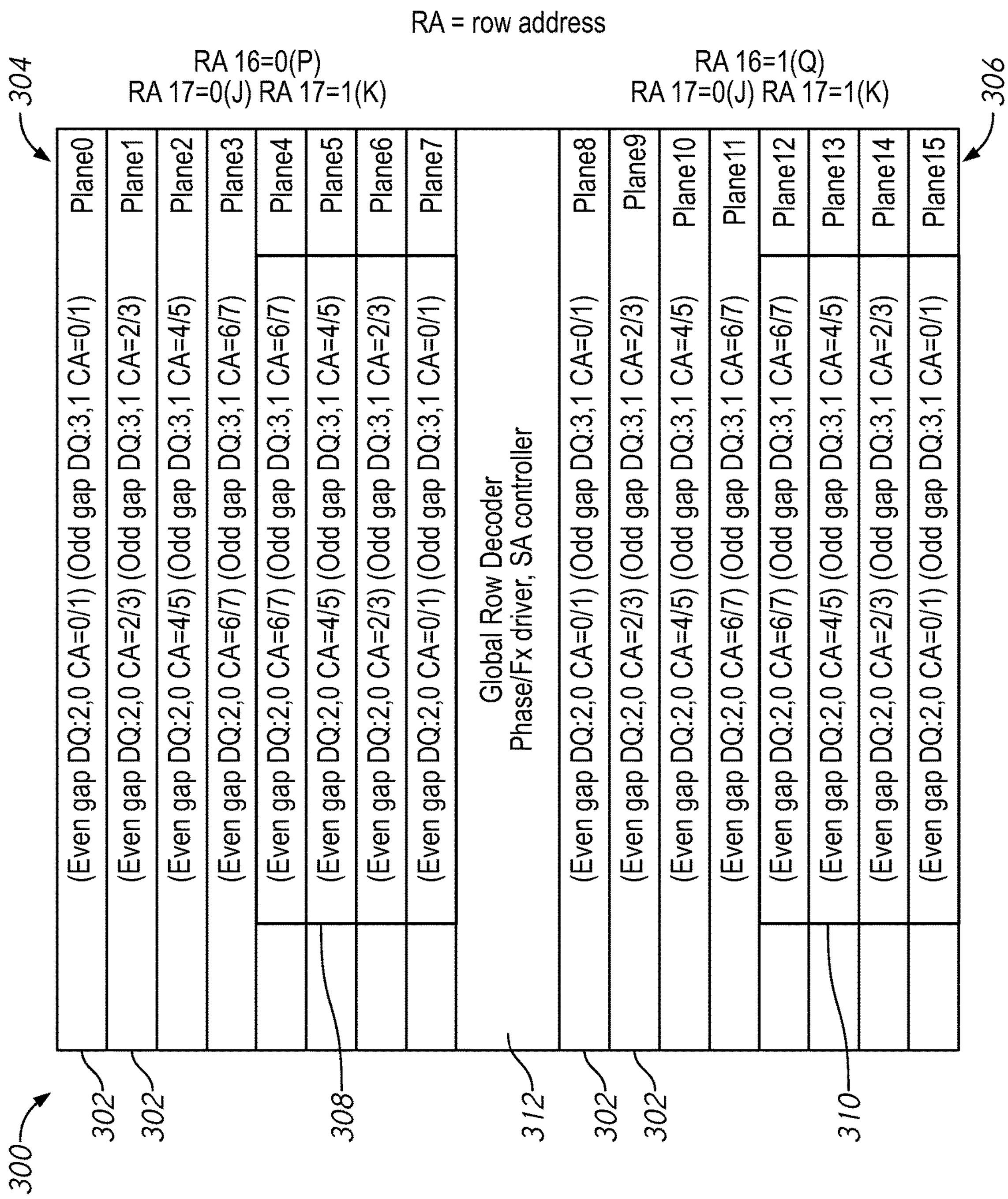
FIG. 3 is an example of a DQ map for an input-output width of four DQ terminals.

FIG. 3 is an example of a DQ map for an input-output width of four DQ terminals. The DQ map 300 represents a DQ mapping for one memory bank (e.g., BANK0-15 in FIG. 2). Each bank of the memory may have the same DQ map. Each row is a plane 302 Plane0-15 of the memory bank. In some embodiments, each plane may include one or more word lines of the memory bank. In the example shown in FIG. 3, the memory bank is separated into two sides P side 304 and Q side 306, where the P side 304 includes Plane0-7 and the Q side 306 includes Plane8-15. The two sides P side 304 and Q side 306 may be separated by a peripheral region 312, The peripheral region 312 may include one or more components of a memory device (e.g., semiconductor device 200) such as a central global row decoder (e.g., row decoder 240), word line phase/FX) driver, and a sense amplifier controller disposed between the two sides. Each side, P, Q is further sub-divided into upper and lower halves J and K. The planes 302 of the K halves are indicated by the boxes 308 (Plane4-7) and 310 (Plane12-15). A row address (RA) including multiple bits may indicate which portion of the bank is activated during an access operation (e.g., read or write). In the example shown, when bit 16 of the row address (RA16), is 0, and bit 17 of the row address (RA17) is 1, the K half of the P side of the bank is accessed. However, other memory banks may have different architectures and/or different address configurations in other examples, and the disclosure is not limited to the specific bank architecture and address configuration shown in the DQ maps disclosed herein.

In the example shown, each plane 302 may provide or receive eight bits during an access operation. The DQ map 300 indicates how bits from each plane 302 are provided to the DQ terminals during a read data burst and how bits from the DQ terminals during a write data burst are stored in the memory planes 302. CA indicates a unit interval (UI) of a data burst at the DQ terminal. In the example shown, the data burst is eight UI's (CA0-C7). For example, when the K half of the P side of the bank is accessed for a write operation, bits received from terminals DQ0-3 during CA0 and CA1 may be stored in Plane7. Similarly, continuing this example, during a read operation, bits may he provided from Plane7 as the bits provided on DQ0-3 during CA0 and CA1 of the burst.

It should be noted that the number of UI's associated with providing or receiving data from the memory planes 302 for a data burst does not necessarily correspond to the number of UI' s associated with a burst length of the data burst on the DQ terminals. Data is provided to and from the memory planes 302. in parallel whereas data provided and received on the DQ terminals is serial. Thus, for example, while it may take one or two UI to write or read bits from the memory planes 302 (e.g., in parallel), it may take eight UI for a memory controller to receive or provide data on the DQ terminals (e.g., in serial). Furthermore, bits provided from the memory planes 302 may undergo buffering and serialization prior to being provided to the DQ terminals. Similarly, bits provided from the DQ terminals may undergo buffering and deserialization prior to being provided to the memory planes 302.

Figure 4:
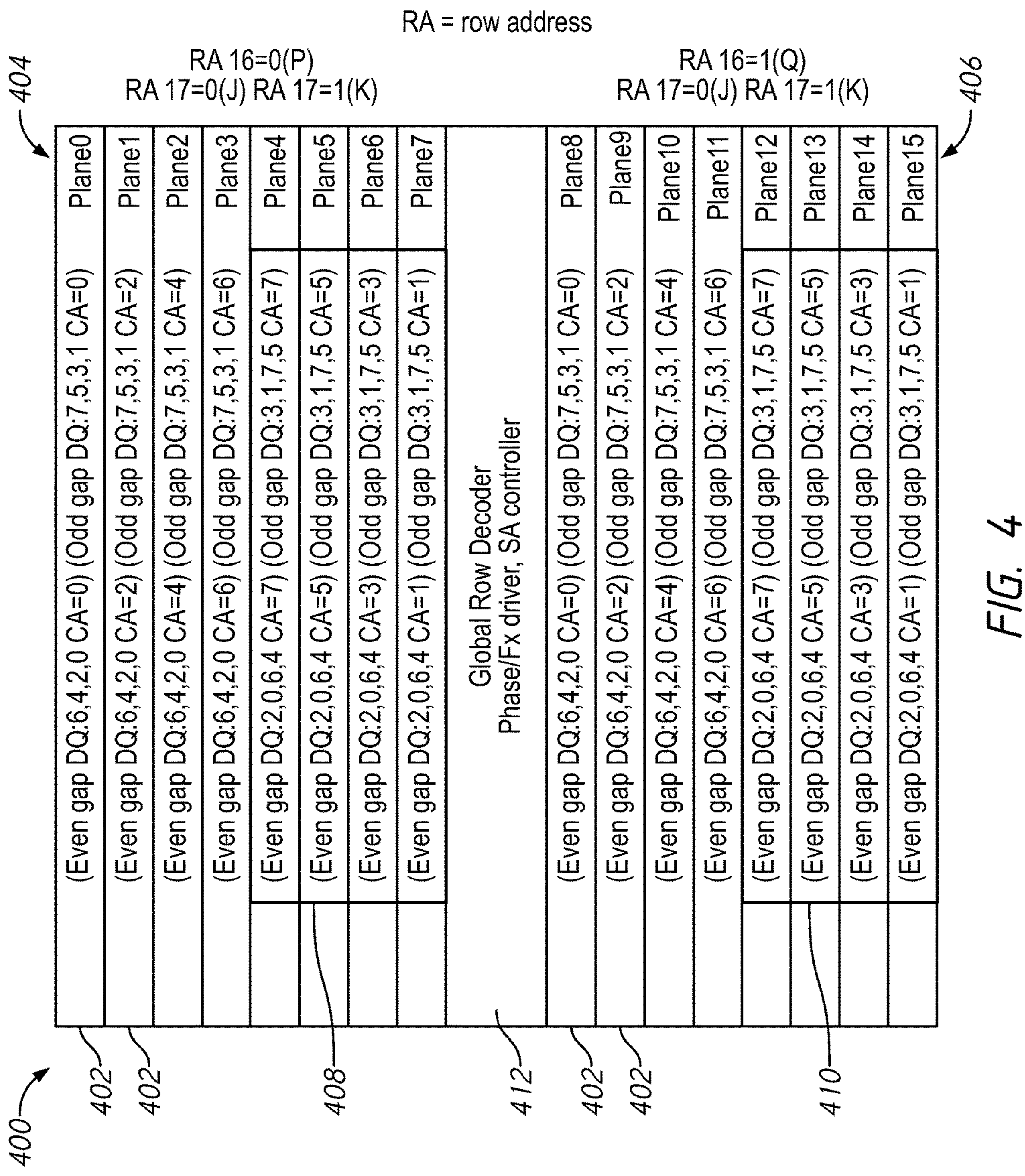
FIG. 4 is an example of a DQ map for an input-output width of eight DQ terminals.

FIG. 4 is an example of a DQ map for an input-output width of eight DQ terminals. The DQ map 400 represents a DQ mapping for one memory bank (e.g,, BANK0-7 in FIG. 2). Each bank of the memory may have the same DQ map. The architecture and address configuration of the bank to which the DQ map 400 corresponds may be the same as the bank corresponding to DQ map 300.

Similar to DQ map 300, DQ map 400 indicates which bits received at which DQ pins at what UI (CA) of a data burst is stored in which memory plane 402 of the memory bank. However, in contrast to DQ map 300, since each memory plane 402 stores eight bits and eight DQ terminals are utilized, each memory plane 402 stores bits associated only with a single CA of the data burst instead of two CA according to DQ map 400. Furthermore, an entire side P side 404 or Q side 406 can be provided bits during a CA, rather than only a half J, K 410.

DQ map 300 and DQ map 400 may both be supported by a same memory device, such as semiconductor device 200. The DQ maps 300, 400 may allow the semiconductor device to operate with external devices having an I/O width of four and an I/O width of eight.

Some memory controllers and/or systems having a same I/O width (e.g., x8) may have differing characteristics that require different DQ mappings for the same I/O width. For example, some systems may be "critical" and have increased requirements for error correction. In some instances, DQ map 400 may not be sufficient to meet these error requirements and a different DQ map may be used.

Sporadic defective bits due to disturbances during reading, writing, and/or transmission or isolated memory cell defects can typically be corrected by ECC operations because these errors typically only affect one or only a few of the bits associated with the same ECC information (e.g., parity bits, code words). However, defective bits may also be caused by physical damage to a portion of the memory array that can affect an entire word line or a group of word lines that are physically proximate one another. If a group of bits are stored in the same proximate physical location in the memory (e.g., same word line, adjacent word lines, same plane), and that physical location is damaged, it is possible most or all of the bits will have errors. If those bits are all associated with the same ECC data, there may be too many errors for the ECC data to correct, and the data will be lost.

Returning to DQ map 400, all of the bits provided on the DQ terminals during a UI are stored in a same memory plane 402. All of the bits for the may have been processed by an ECC/DBI circuit (such as ECC/DBI circuit 255) and may be associated with the same ECC data. If the memory plane 402 in which all the bits for a UI are stored is damaged, there may be more bits with errors than the ECC data can correct. Accordingly, for error-sensitive systems, it may be desirable to have a different DQ map than the DQ map 400.

Figure 5:
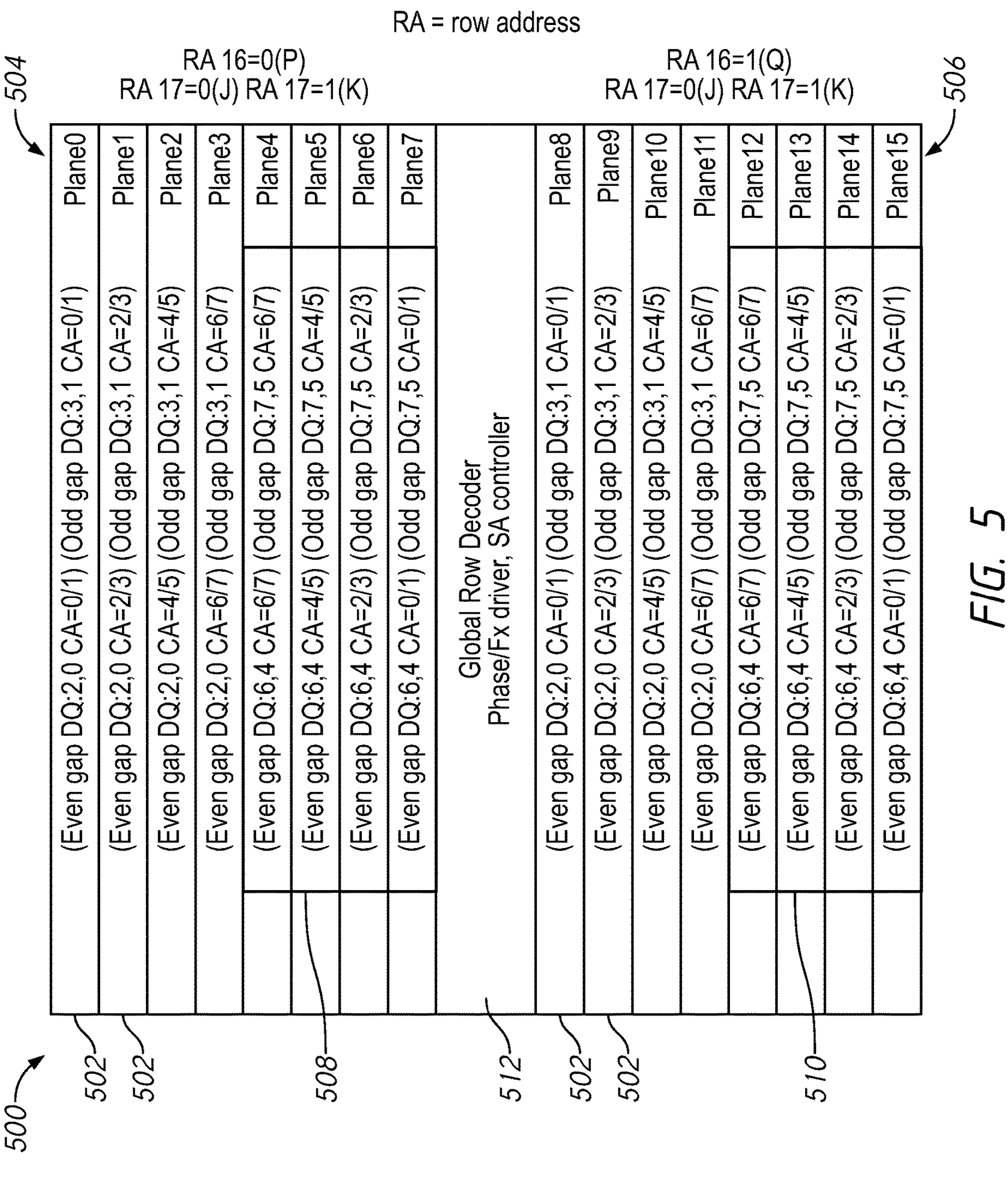
FIG. 5 is another example of a DQ map for an input-output width of eight DQ terminals.

FIG. 5 is another example of a DQ map for an input-output width of eight DQ terminals. The DQ map 500 represents a DQ mapping for one memory bank (e.g., BANK0-7 in FIG. 2). The architecture of the bank to which the DQ map 500 corresponds may be the same as the bank corresponding to DQ map 300 and/or DQ map 400.

While similar to DQ map 400 in that all eight DQ terminals DQ0-7 are utilized and an entire side P 504 or Q 506 of the memory bank can be provided bits during a CA, rather than only a half J, K 510, DQ map 500 is similar to DQ map 300 in that the memory planes 502 store data for multiple UIs (e.g., CA0 and CA1, CA2 and CA3, etc.). Thus, in the example shown in FIG. 5, half the bits stored in a memory plane 502 are from one UI and the other half of the bits are from another UI.

All of the bits provided on the DQ terminals during a same UI of a data burst (e.g., DQ0-7 during CA0) may be associated with the same ECC data, such as ECC data provided by ECC/DBI circuit 255. However, unlike DQ map 400, when DQ map 500 is utilized by a memory device, such as semiconductor device 200, the bits may be stored in two different physical locations in the memory—two different memory planes 502. In some applications, this may decrease the risk of more bits having errors than the ECC data can correct.

However, despite DQ map 500 having the advantage of error resistance, DQ map 400 may be more desirable in some applications. For example, DQ map 400 may support data masking and DQ map 500 may not. Thus, some users of a memory device, such as semiconductor device 200, may find DQ map 500 preferable whereas other users may prefer DQ map 400. Providing different memory devices for different users may be cost prohibitive or otherwise impractical. Accordingly, just as it may be desirable to provide a device that supports multiple I/O widths, it may be desirable to provide a device that provides different DQ maps for different applications. While a DQ map that provides increased error resistance is provided as an example, other DQ maps that provide other features may be used in other embodiments.

While DQ maps 300-500 are shown as a table, the mapping indicated by a DQ map may be implemented by various components such as conductive paths (e.g., between the memory array and the DQ terminals), drivers (e.g., read and write drivers), repeaters (e.g., amplifiers), logic circuits (e.g., multiplexers, AND gates), some or all of which may be included in or coupled to an 10 circuit, such as IO circuit 260. Supporting multiple DQ maps may require additional components, even if the DQ maps are for a same I/O width. According to embodiments of the present disclosure, one or more components used to implement one DQ map may be used to implement another DQ map. In some embodiments, the two DQ maps may have different I/O widths. In the examples disclosed herein, a memory device, such as semiconductor device 200, may support implementation of all three DQ maps 300-500.

Figure 6:
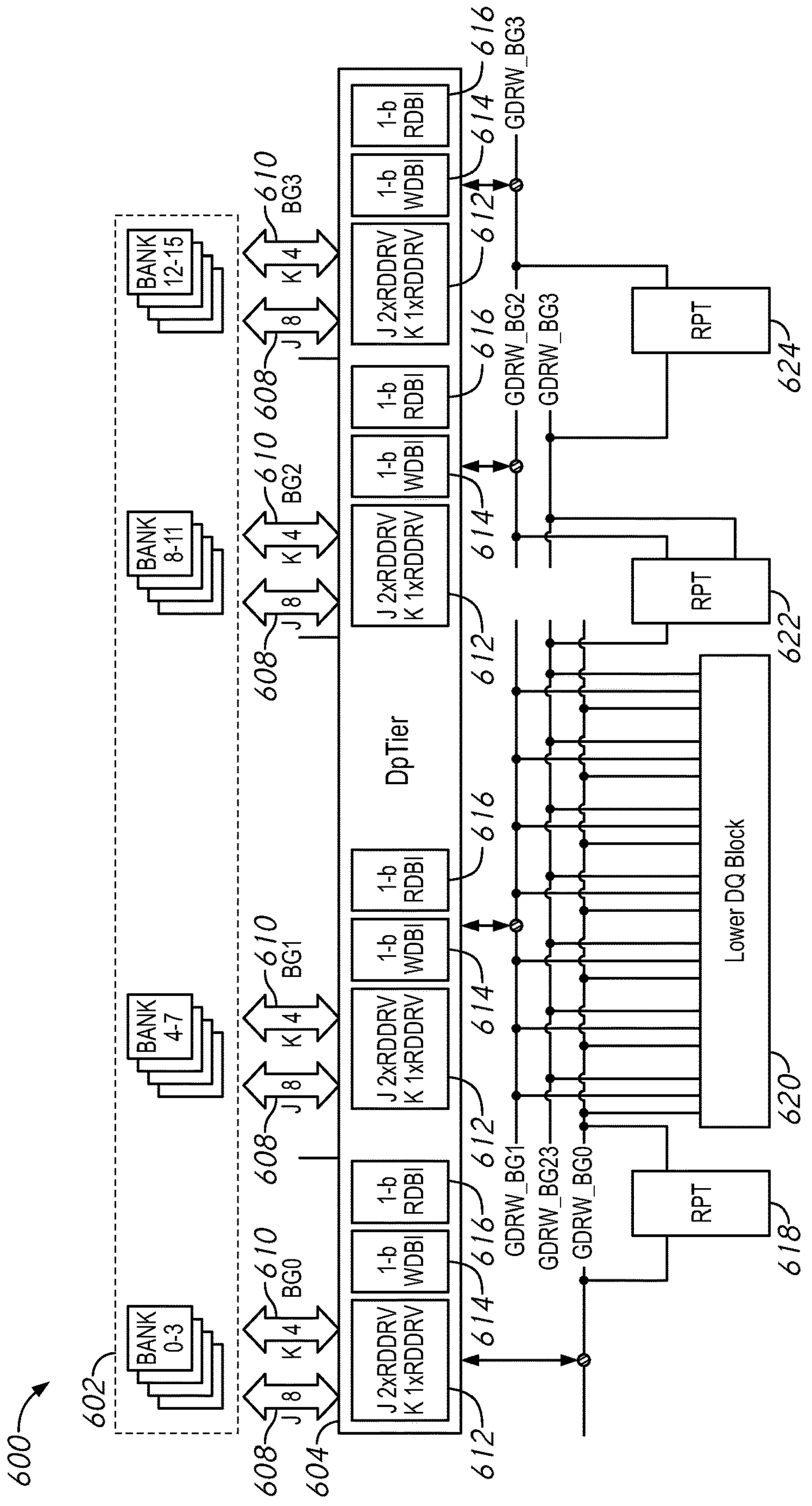
FIG. 6 is a block diagram of a portion of a semiconductor device.

FIG. 6 is a block diagram of a portion of a semiconductor device. In some embodiments, the semiconductor device 600 may be included in semiconductor device 200. The semiconductor device 600 may support multiple DQ maps to allow operations with different 110 widths, for example, DQ map 300 and DQ map 400.

Semiconductor device 600 may include a memory array 602 organized into bank groups BG0-4, each bank group including four memory banks BANK0-15. While four bank groups with four memory banks is shown in this example, other numbers of memory banks and/or organization into bank groups may be used in other examples. The semiconductor device 600 may further include a lower DQ block 620 that may include multiple output terminals, such as DQ terminals, DM terminals, and/or DBI terminals. The memory array 602 may be coupled to the lower DQ block 620 via a variety of circuits.

Each memory bank BANK0-15 may have a same structure as the memory banks shown in DQ maps 300 and 400. Each memory bank BANK0-15 may be coupled to a DpTier region 604 of the semiconductor device 600 by multiple data lines. In the example shown, eight data lines 608 are provided to each J side of the P and Q portions of the memory bank and four data lines 610 are provided to each K side of the P and. Q portions. The difference in the number of data lines between the K side and the J side is due to the change in order of the DQ terminals for the J side between DQ map 300 and DQ 400, whereas the order of the first two DQ terminals for the K side is the same for DQ map 300 and DQ 400.

The DpTier region 604 includes a driver circuit 612 for each bank group, which includes two read drivers for each J side and one read driver for each K side. The additional read driver is provided to drive the additional data lines 608 for the J side. The DpTier region 604 further includes write DBI (WDBI) circuits 614 and read DBI (RDBI) circuits 616 to generate DBI information for the data provided from the memory array 602 for write and read operations, respectively. The DBI information may be a single-bit (1-b) signal in some embodiments, as shown in FIG. 6.

The data and the DBI information may be provided from the DpTier region 604 to one of a set of data busses GDRW_BG0, GDRW_BG1, GDRW_BG2, GDRW_BG3, each corresponding to a bank group BG0-3. Optionally, as shown in FIG. 6, the data and DBI information from BG0 may be provided to a repeater circuit 618, data and DBI information from BG2 may be provided to repeater circuit 622, and data and DBI information from BG3 may be provided to repeater circuit 624 and/or repeater circuit 622 prior to being provided to the DQ block 620. The repeater circuits 618, 622, and 624 may amplify the signals from the bank groups, which may have diminished over the distance of the data buses. However, if the bank groups, such as BG1, are sufficiently close to the DQ block 620, or the signal is sufficiently strong, one or more of the repeater circuits 618, 622, and 624 may be omitted.

However, the circuitry of semiconductor device 600 may not support multiple DQ maps for a same I/O width. For example, semiconductor device 600 may support DQ map 300 but only one of DQ map 400 or DQ map 500.

Figure 7:
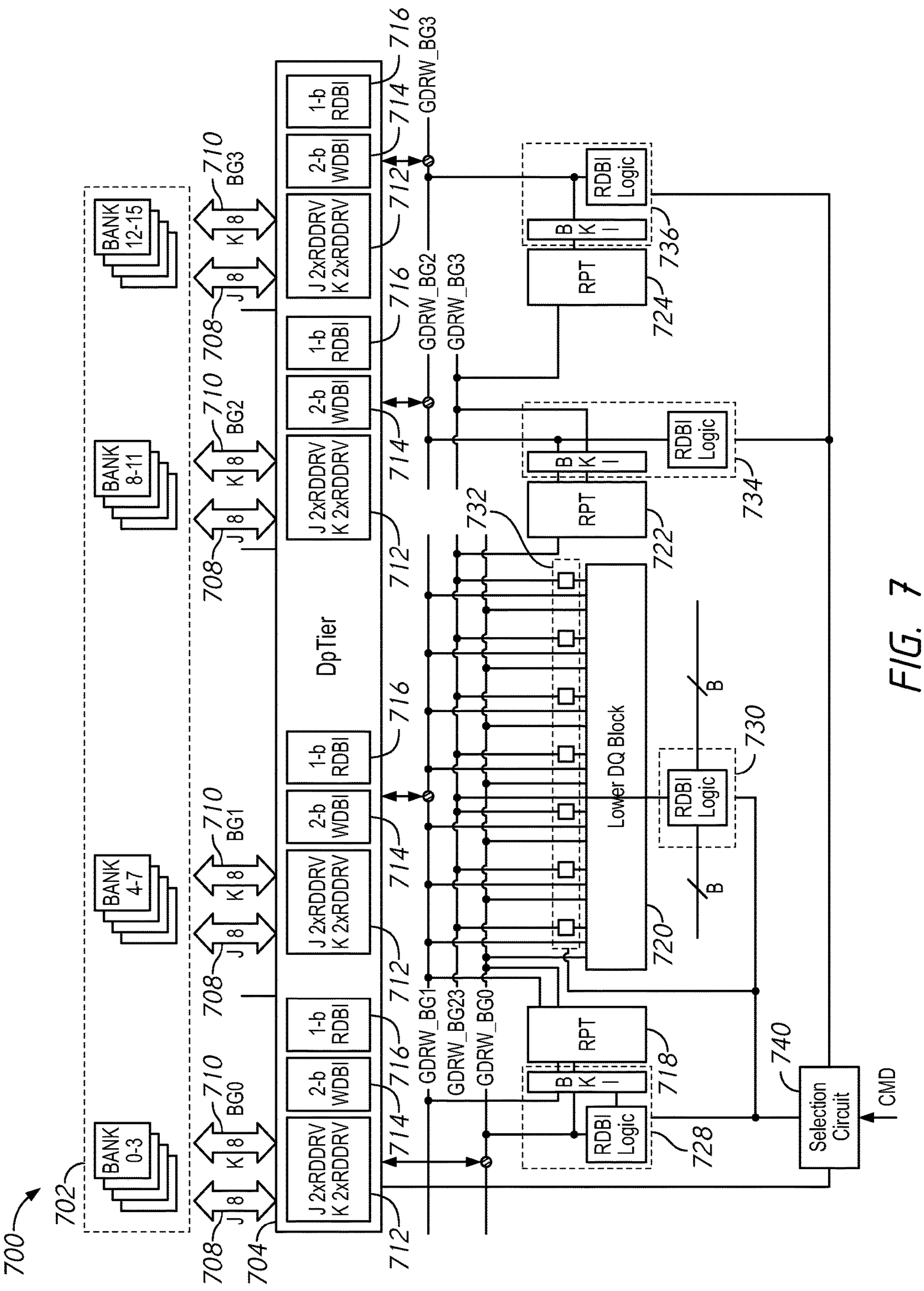
FIG. 7 is a block diagram of a portion of a semiconductor device according to at least one embodiment of the disclosure.

FIG. 7 is a block diagram of a portion of a semiconductor device according to at least one embodiment of the disclosure. The semiconductor device 700 may be included in semiconductor device 200 in some embodiments. The semiconductor device 700 may support multiple DQ maps, including DQ maps for a same I/O width. For example, in some embodiments, semiconductor device 700 may support DQ map 300, DQ map 400, and DQ map 500.

As shown in FIG. 7, semiconductor device 700 may include some components that are substantially the same as semiconductor device 600. Thus, for brevity, the functions of components in semiconductor device 700 that are substantially the same as the components of semiconductor device 600 will not be described in detail with reference to semiconductor device 700. When appropriate, differences in circuits and components between semiconductor device 600 and semiconductor device 700 will be noted.

Similar to semiconductor device 600, data is provided from the bank groups BG0-3 of the memory array 702 to a DpTier region 704 by data lines. Comparing DQ map 300 and DQ map 500, the DQ mapping for the memory planes of the J side is the same, so the data lines 708 may be substantially the same as data lines 608. However, the data for the memory planes of the K side are swapped between the DQ map 300 and the DQ map 500. Accordingly, eight data lines 710 are provided for each K side, four more than in the data lines 610. Although not shown in FIG. 7, in some embodiments, a multiplexer may be used to swap data the on the K side to implement DQ mapping according to DQ map 500. In order to support the additional data lines 710, the driver circuit 712. for each bank group may include two read drivers for each J side and two read drivers for each K side. Thus two read drivers are provided for both the J side and the K side rather than only one read driver for the K side as in driver circuit 612.

When DQ map 500 is implemented, data from two UI may be provided. Thus, DBI information must be a two bit signal to generate data for both UI rather than a single bit signal. Additional logic may be provided in the WDBI circuit 714 to provide 2-b WDBI information. In some embodiments, the RDBI circuit 716 may also include additional logic to generate 2-b RDBI information. However, in some embodiments, the DpTier region 704 may be crowded, and adding the additional logic may require increasing the die size of semiconductor device 700. This may be undesirable in some applications.

In some embodiments, the region surrounding the DQ block 720 and repeaters 718, 722, 724 may be less congested than the DpTier region 704. Accordingly, in some embodiments, such as the one shown in FIG. 7, additional RDBI circuits 728, 730, 732, 734, and 736 for providing the second bit of the RDBI information may be located along the data bus lines GDRW_BG0, GDRW_BG1, GDRW_BG2, GDRW_BG3. Placing the additional RDBI circuits 728, 730, 732, 734, and 736 outside the DpTier region 704 may reduce or eliminate the increase in die size required to support all three DQ maps 300, 400, and 500. 10621 in some embodiments, semiconductor device 700 may include a. selection circuit 740. The selection circuit 740 may include one or more fuses, anti-fuses, and/or switches. The selection circuit 740 may selectively activate or deactivate (e.g., enable or disable) one or more of the components of semiconductor device 700 depending on which of the multiple DQ maps is to be implemented. For example, if DQ map 300 or 400 are implemented, the selection circuit 740 may disable the additional read drivers on the K side in the driver circuits 712, the additional logic for the 2-b WDBI signal in the WDBI circuits 714, and/or the additional RDBI circuits 728, 730, 732, 734, and 736. In some embodiments, the selection circuit 740 may provide a signal to one or more multiplexers (not shown) to implement data swapping or other signal routing. In some embodiments, the selection circuit 740 may be initially programmed by a manufacturer of the semiconductor device 700. In other embodiments, the selection circuit 740 may be programmed by a user of the semiconductor device 700. For example, the user may provide a command via a command address terminal (e.g., as shown in FIG. 2) to set a state of one or more fuses, anti-fuses, and/or switches of the selection circuit 740. In some embodiments, the selection circuit 740 may be programmed to select a desired DQ map by writing a value to a mode register, such as mode register 230. The value in the mode register may determine the state of the one or more fuses, anti-fuses, and/or switches of the selection circuit 740. In some embodiments, the selection circuit 740 may only be programmed once. That is, once selected, the DQ mapping for the semiconductor device 700 cannot be changed. In other embodiments, the DQ mapping may be changed by providing additional commands to select a different DQ map.

While the example shown in FIG. 7 shows that certain circuits may be used to support, at least in part, multiple DQ maps, in other examples, the circuitry for supporting different DQ maps may be mutually exclusive.

The circuitry for supporting multiple DQ maps shown in FIGS. 6 and 7 are provided merely as examples and are based on the specific DQ map examples provided in FIGS. 3-5. However, other DQ maps may also be implemented by different circuits, The specific circuits may be based, at least in part, on the relationships between the different DQ maps supported by a semiconductor device may.

Figure 8:
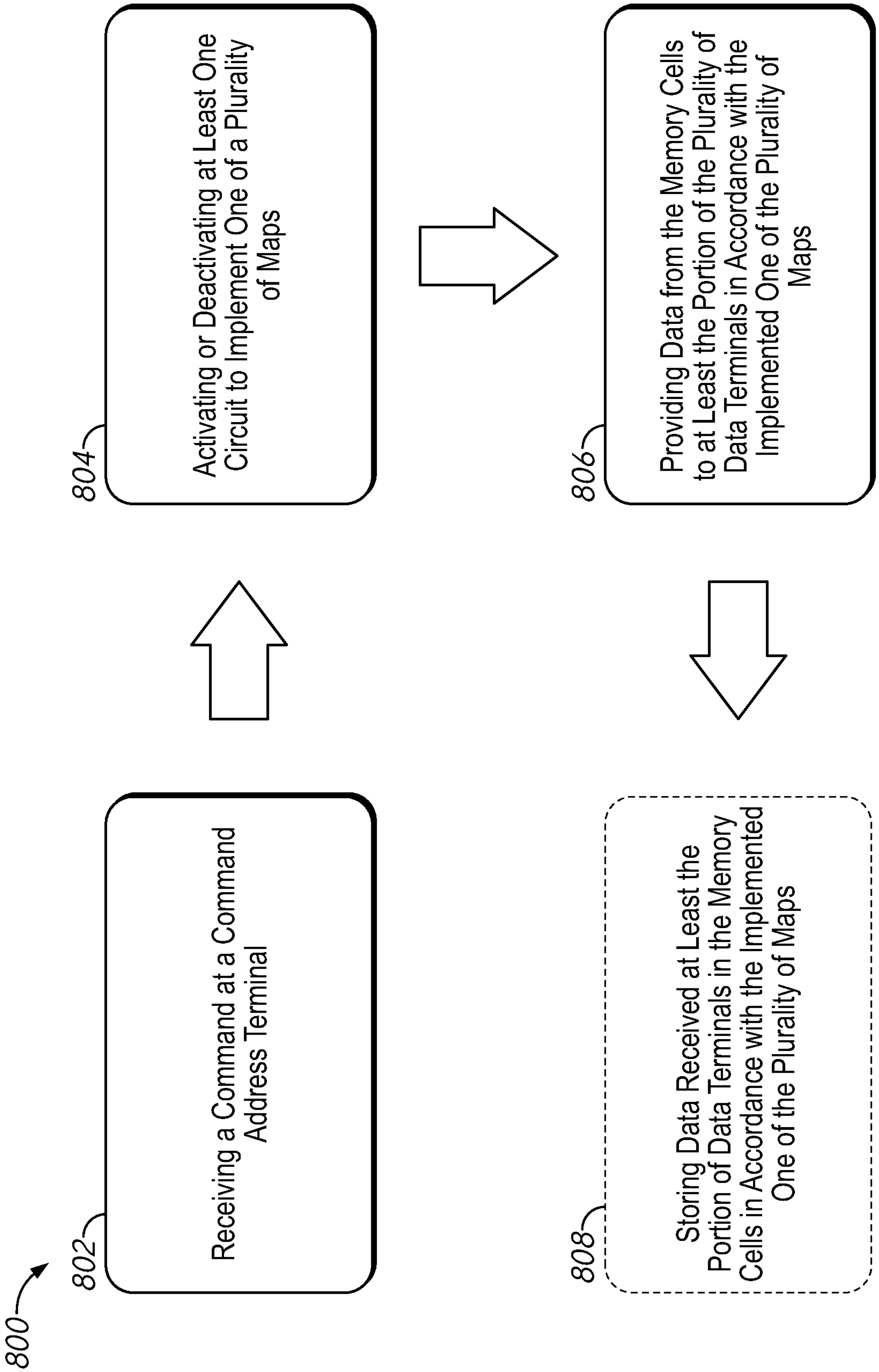
FIG. 8 is a flow chart of a method according to at least one embodiment of the disclosure.

FIG. 8 is a flow chart of a method according to at least one embodiment of the disclosure. In some embodiments, the method 800 may be performed in whole or in part by a semiconductor device, such as semiconductor device 200 and/or 700.

At block 802, "receiving a command at a command address terminal" may be performed. The command may be received at a semiconductor device, such as semiconductor device 200, 600, and/or 700. The command may be received from a memory controller, such as memory controllers 101(A)-101(C).

Responsive to the command, at block 804, "activating or deactivating at least one circuit to implement one of a plurality of maps" may be performed. The maps may be DQ maps wherein individual ones of the plurality of maps indicates a relationship between a plurality of memory cells and at least a portion of a plurality of data terminals. At least two of the plurality of maps may indicate relationships for a same portion of the plurality of data terminals. That is, at least two of the DQ maps may be for a same I/O width (e.g., x8, x4). In some embodiments, activating or deactivating the at least one circuit may include setting a state of at least one of a fuse, an anti-fuse, or a switch.

At block 806 "providing data from the memory cells to at least the portion of the plurality of data terminals in accordance with the implemented one of the plurality of maps" may be performed. Additionally or alternatively, at block 808, "storing data received at least the portion of data terminals in the memory cells in accordance with the implemented one of the plurality of maps" may be performed.

The apparatuses, systems, and methods disclosed herein may support multiple DQ mappings in a memory device. Different DQ mappings may be provided for different I/O widths as well as for same I/O widths. The different DQ mappings for the same I/O width may provide at least some different features from one another. This may allow a memory device to be utilized by a wider array of customers and/or in a wider array of applications. In some embodiments, circuitry for supporting DQ maps for different I/O widths may be used to support, at least in part, one or more of the multiple DQ maps for the same I/O width. This may reduce the number of additional circuits or other components required to support the multiple DQ maps.

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

What is claimed is:

1. An apparatus, comprising:

a plurality of data terminals;

a memory bank comprising a plurality of memory cells: and a plurality of circuits comprising a first plurality of circuits and a second plurality of circuits, wherein the first plurality of circuits is configured to implement a first map between the memory bank and the plurality of data terminals and the second plurality of circuits is configured to implement a second map between the memory bank and the plurality of data terminals, wherein the first map indicates a first relationship between the plurality of memory cells of the memory bank and the plurality of data terminals and the second map indicates a second relationship, different from the first relationship, between the plurality of memory cells of the memory bank and the plurality of data terminals.

2. The apparatus of claim 1, wherein the plurality of circuits further comprises a third plurality of circuits configured to implement a third map between the memory bank and a subset of the plurality of data terminals, wherein the subset comprises less than all of the plurality of data terminals.

3. The apparatus of claim 2, wherein at least one of the first plurality of circuits and the second plurality of circuits includes at least a portion of the third plurality of circuits.

4. The apparatus of claim 1, wherein circuits of the first plurality of circuits and circuits of the second plurality of circuits are mutually exclusive.

5. The apparatus of claim 1, wherein at least one of the plurality of circuits comprises a circuit configured to provide data bus inversion information for a plurality of bits provided on corresponding ones of the plurality of data terminals.

6. The apparatus of claim 1, wherein at least one of the plurality of circuits comprises a circuit configured to provide error correction code (ECC) data for a plurality of bits provided on corresponding ones of the plurality of data terminals.

7. The apparatus of claim 1, further comprising at least one of a fuse, an anti-fuse, or a switch, wherein the plurality of circuits are configured to implement the first map or the second map based, at least in part, on a state of the fuse, the anti-fuse, or the switch.

8. The apparatus of claim 7. wherein at least a portion of the plurality of circuits are enabled or disabled based, at least in part, on the state of the fuse, the anti-fuse, or the switch.

9. The apparatus of claim 1, wherein the first relationship indicates a memory cell of the plurality of memory cells where a bit received from one of the plurality of data terminals is stored.

10. A system, comprising:

a memory controller comprising a first plurality of data terminals; and a memory device comprising:

a second plurality of data terminals, wherein at least a portion of the second plurality of data terminals are coupled to the first plurality of data terminals;

a memory bank comprising a plurality of memory cells; and a plurality of circuits configured to implement one of a first map or a second map, wherein the first map indicates a first relationship between the plurality of memory cells of the memory bank and the portion of the second plurality of data terminals coupled to the first plurality, and the second map indicates a second relationship, different from the first relationship, between the plurality of memory cells of the memory bank and the portion of the second plurality of data terminals coupled to the first plurality.

11. The system of claim 10, wherein a number of the first plurality of data terminals is equal to a number of the second plurality of data terminals.

12. The system of claim 10, wherein the memory controller is configured to provide a command to the memory device to cause the plurality of circuits to implement the first map or the second map.

13. The system of claim 12, wherein the memory device comprises a mode register and the command comprises a mode register write command.

14. The system of claim 12, wherein the memory device comprises at least one of a fuse, an anti-fuse, or a switch, and the command sets a state of at least one of the fuse, the anti-fuse, or the switch.

15. The system of claim 12, wherein the plurality of circuits comprises a first plurality of circuits configured to implement the first map and a second plurality of circuits configured to implement the second map.

16. The system of claim 15, wherein the plurality of circuits further comprises a third plurality of circuits configured to implement a third map between the memory bank and a number of the second plurality of data terminals different than a number of the portion of the second plurality of data terminals coupled to the first plurality of data terminals.

17. The system of claim 16, wherein at least one of the first plurality of circuits and the second plurality of circuits includes at least a portion of the third plurality of circuits.

18. A method comprising:

receiving a command at command address terminals;

responsive to the command, activating or deactivating at least one circuit to implement one of a plurality of maps, wherein individual ones of the plurality of maps indicates a relationship between a plurality of memory cells and at least a portion of a plurality of data terminals, wherein at least two of the plurality of maps indicate relationships for a same portion of the plurality of data terminals; and providing data from the memory cells to at least the portion of the plurality of data terminals in accordance with the implemented one of the plurality of maps.

19. The method of claim 18, further comprising storing data received on at least the portion of data terminals in the memory cells in accordance with the implemented one of the plurality of maps.

20. The method of claim 18, wherein activating or deactivating the at least one circuit comprises setting a state of at least one of a fuse, an anti-fuse, or a switch.

21. The method of claim 18, wherein activating or deactivating the at least one circuit comprises writing a value to a mode register.

22. The method of claim 18, wherein the portion of the plurality of data. terminals comprises all of the plurality of data terminals.

* * * * *